United States Patent
Bucher et al.

(10) Patent No.: US 9,214,200 B2
(45) Date of Patent: Dec. 15, 2015

(54) METHODS AND APPARATUS FOR TRANSMITTING DATA IN A PHASE MODULATED SIGNAL DERIVED FROM EARLY AND LATE TIMING SIGNALS

(75) Inventors: Michael Bucher, Durham, NC (US); John Wilson, Raleigh, NC (US)

(73) Assignee: Rambus Inc., Sunnyvale, CA (US)

( * ) Notice: Subject to any disclaimer, the term of this patent is extended or adjusted under 35 U.S.C. 154(b) by 553 days.

(21) Appl. No.: 13/635,028

(22) PCT Filed: Feb. 26, 2011

(86) PCT No.: PCT/US2011/026380
§ 371 (c)(1),
(2), (4) Date: Sep. 14, 2012

(87) PCT Pub. No.: WO2011/126619
PCT Pub. Date: Oct. 13, 2011

(65) Prior Publication Data
US 2013/0009686 A1    Jan. 10, 2013

Related U.S. Application Data

(60) Provisional application No. 61/320,878, filed on Apr. 5, 2010.

(51) Int. Cl.
*G06F 1/04* (2006.01)
*G06F 1/12* (2006.01)
(Continued)

(52) U.S. Cl.
CPC ............ *G11C 7/1051* (2013.01); *G06F 1/0342* (2013.01); *G06F 1/06* (2013.01); *G06F 13/4243* (2013.01); *G11C 7/1066* (2013.01); *G11C 7/1078* (2013.01); *G11C 7/1093* (2013.01); *H04B 3/32* (2013.01); *H04L 7/0008* (2013.01);
(Continued)

(58) Field of Classification Search
None
See application file for complete search history.

(56) References Cited

U.S. PATENT DOCUMENTS 4,201,942 A    5/1980    Downer
5,600,634 A    2/1997    Satoh et al.
(Continued)

FOREIGN PATENT DOCUMENTS

JP    2002-204272    7/2002
WO    WO-00/22499    4/2000

OTHER PUBLICATIONS

Gabara, T., "Phantom Mode Signaling in VLSI Systems," Conference on Advanced Research in VLSI, Mar. 2001, pp. 88-100. 13 pages.

(Continued)

*Primary Examiner* — Ji H Bae
(74) *Attorney, Agent, or Firm* — Silicon Edge Law Group LLP; Arthur J. Behiel

(57) ABSTRACT le;.5qA system includes a transmitter circuit and a receiver circuit that are coupled together through transmission lines. The transmitter circuit generates an early timing signal, a nominal timing signal, and a late timing signal. A multiplexer circuit selects between the early and the late timing signals based on a data signal to generate an encoded output signal that encodes the data signal. The nominal timing signal and the encoded output signal are transmitted through the transmission lines to the receiver circuit. The receiver circuit samples the encoded output signal in response to the nominal timing signal to generate even and odd sampled data signals. Complementary timing signals can be transmitted through transmission lines on opposite sides of the encoded output signal to provide crosstalk cancellation.

19 Claims, 4 Drawing Sheets

(51) Int. Cl.
| | | |
|---|---|---|
| *H04L 7/00* | (2006.01) | |
| *G06F 5/06* | (2006.01) | |
| *G11C 7/10* | (2006.01) | |
| *G06F 1/03* | (2006.01) | |
| *G06F 13/42* | (2006.01) | |
| *G06F 1/06* | (2006.01) | |
| *H04B 3/32* | (2006.01) | |
| *H04L 25/02* | (2006.01) | |
| *G06F 13/38* | (2006.01) | |

(52) U.S. Cl.
CPC .......... *H04L 25/026* (2013.01); *H04L 25/0264* (2013.01); *G06F 1/04* (2013.01); *G06F 13/38* (2013.01); *G11C 7/1072* (2013.01)

(56) References Cited

U.S. PATENT DOCUMENTS

| | | | |
|---|---|---|---|
| 5,642,487 A * | 6/1997 | Flynn et al. | 711/167 |
| 6,115,430 A | 9/2000 | Tanaka et al. | |
| 6,137,332 A | 10/2000 | Inoue et al. | |
| 6,492,984 B2 | 12/2002 | Martin | |
| 6,597,202 B1 | 7/2003 | McCall et al. | |
| 6,643,317 B1 * | 11/2003 | Blumer | 375/130 |
| 6,697,420 B1 * | 2/2004 | Simon et al. | 375/220 |
| 6,956,908 B2 * | 10/2005 | Forbes | 375/283 |
| 6,965,262 B2 | 11/2005 | Zerbe | |
| 7,012,956 B1 | 3/2006 | Thomsen et al. | |
| 7,064,585 B2 | 6/2006 | Glass | |
| 7,158,593 B2 | 1/2007 | Kim et al. | |
| 7,224,737 B2 | 5/2007 | Voutilainen | |
| 7,508,881 B2 | 3/2009 | Choi et al. | |
| 7,535,964 B2 | 5/2009 | Murdock | |
| 7,609,102 B2 | 10/2009 | Shanbhag et al. | |
| 2003/0081709 A1 | 5/2003 | Ngo et al. | |
| 2003/0188215 A1 * | 10/2003 | Lamb et al. | 713/503 |
| 2004/0123207 A1 | 6/2004 | Zumkehr et al. | |
| 2004/0165677 A1 * | 8/2004 | Shen et al. | 375/290 |
| 2004/0223566 A1 | 11/2004 | Yamashita | |
| 2004/0239374 A1 | 12/2004 | Hori | |
| 2005/0128826 A1 * | 6/2005 | Kwack et al. | 365/194 |
| 2005/0182983 A1 * | 8/2005 | Gaskins et al. | 713/322 |
| 2006/0093029 A1 * | 5/2006 | Becker et al. | 375/239 |
| 2006/0164909 A1 | 7/2006 | Gower et al. | |
| 2006/0181320 A1 | 8/2006 | Dreps et al. | |
| 2006/0188043 A1 | 8/2006 | Zerbe et al. | |
| 2007/0008791 A1 | 1/2007 | Butt et al. | |
| 2007/0064462 A1 | 3/2007 | Matsui | |
| 2008/0056415 A1 | 3/2008 | Chang et al. | |
| 2008/0080647 A1 | 4/2008 | Altmann et al. | |
| 2008/0170643 A1 | 7/2008 | Lee | |
| 2009/0083567 A1 * | 3/2009 | Kim et al. | 713/501 |
| 2009/0174455 A1 | 7/2009 | Dimitriu et al. | |
| 2009/0289675 A1 | 11/2009 | Lee | |
| 2009/0323444 A1 | 12/2009 | Kim et al. | |
| 2010/0014610 A1 | 1/2010 | Jaso | |
| 2010/0266081 A1 * | 10/2010 | Ditlow et al. | 375/371 |
| 2013/0086410 A1 * | 4/2013 | Kurd et al. | 713/501 |

OTHER PUBLICATIONS

International Search Report and Written Opinion issued in PCT/US2008/081477, dated Mar. 27, 2009. 13 pages.
International Search Report and Written Opinion issued in PCT/US2008/081478, dated Jan. 8, 2009. 15 pages.
PCT Search Report and the Written Opinion dated Sep. 1, 2011 for International Application No. PCT/US2011/026380. 11 pages.
Preliminary Examination Report dated Mar. 7, 2011 re International Application No. PCT/US2008/081477. 6 pages.

* cited by examiner

METHODS AND APPARATUS FOR TRANSMITTING DATA IN A PHASE MODULATED SIGNAL DERIVED FROM EARLY AND LATE TIMING SIGNALS

CROSS REFERENCE TO RELATED APPLICATION

This patent application claims the benefit of U.S. provisional patent application 61/320,878, filed Apr. 5, 2010, which is incorporated by reference herein in its entirety.

TECHNICAL FIELD

This disclosure relates to electronic circuits, and more particularly, to techniques for transmission of information between a transmitter and a receiver.

BACKGROUND

In some conventional source synchronous timing systems, a timing signal and a related data signal may experience timing skew relative to one another. Power supply induced jitter (PSIJ) in the timing signal may not be common with the PSIJ in the data signal. The different PSIJ between the clock and the data signals may have an adverse effect on the receiver's ability to accurately sample the data signal.

DETAILED DESCRIPTION

According to embodiments described in more detail below, a system, circuits and techniques for exchanging information between two different circuits disposed on a single chip or two different circuits disposed on separate integrated circuit devices (ICs) is disclosed. In an embodiment, the system includes a transmitter circuit on a first IC and a receiver circuit on a second IC, which are coupled together through transmission lines. The transmitter circuit generates an early timing signal, a nominal timing signal, and a late timing signal. The nominal timing signal is delayed relative to the early timing signal. The late timing signal is delayed relative to the nominal timing signal. A multiplexer circuit selects between the early and the late timing signals based on a data signal to generate an encoded output signal that encodes the data signal. The nominal timing signal and the encoded output signal are transmitted through the transmission lines to the receiver circuit. The receiver circuit samples the encoded output signal in response to the nominal timing signal to generate sampled data signals. By delay encoding the data using early and late versions of the timing signal output at the transmitter as the encoded output signal, the edges of the nominal timing signal occur nominally centered in the sampling windows of the encoded output signal.

The system, in an embodiment, includes a first circuit disposed on a first IC, a second circuit disposed on a second IC, and three transmission lines. The three transmission lines are coupled to the first and the second circuits. The first circuit transmits a first timing signal through a first transmission line to the second circuit. The first circuit transmits a signal containing encoded data through a second transmission line to the second circuit. The first circuit transmits a second timing signal that is an inverse of the first timing signal through a third transmission line to the second circuit. The first and the third transmission lines are adjacent to and on opposite sides of the second transmission line. The timing signals transmitted through the first and the third transmission lines cancel crosstalk in the signal containing the encoded data that is transmitted through the second transmission line.

Figure 1A:
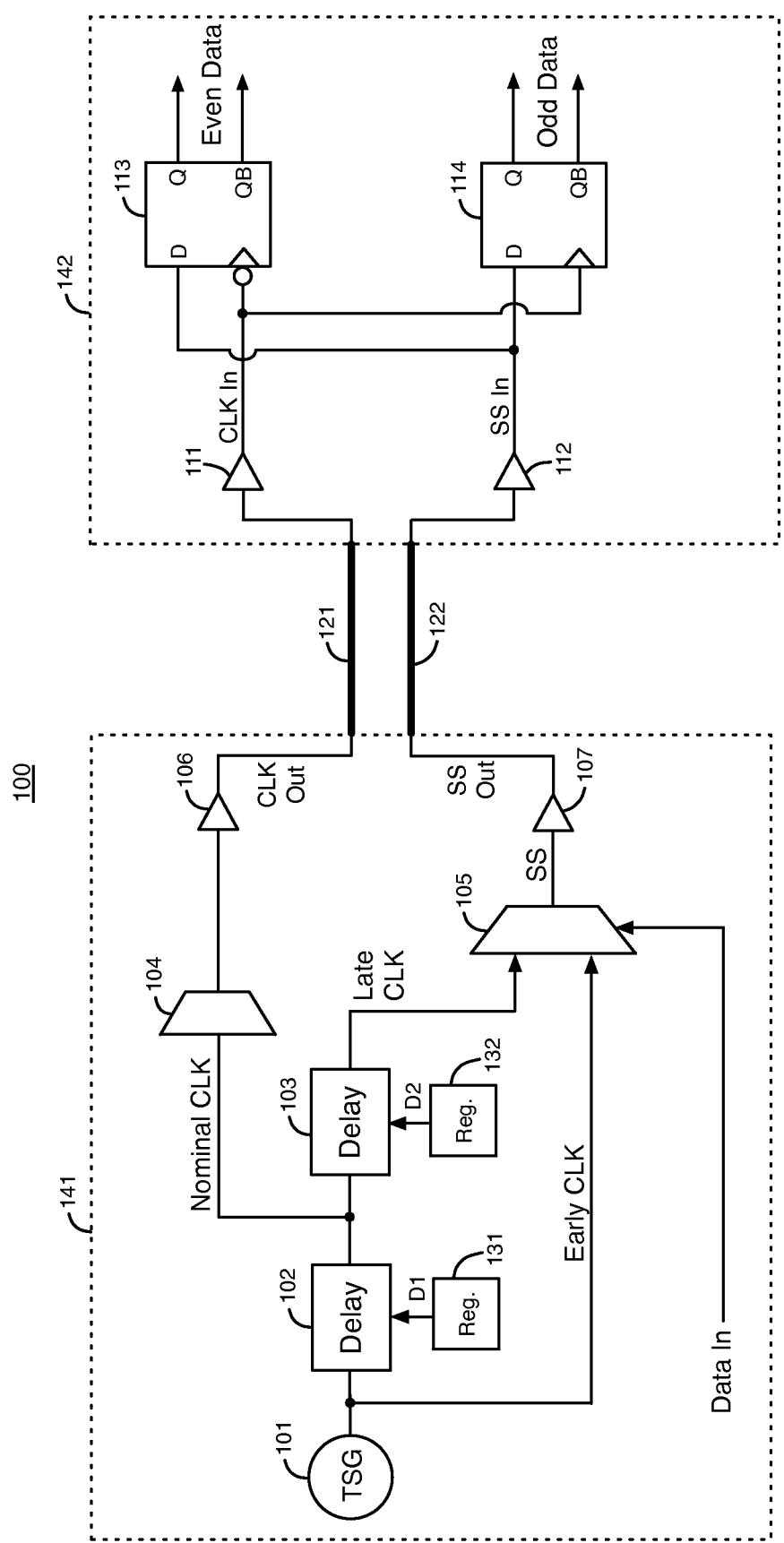
FIG. 1A illustrates an example of a system that transmits a timing signal and a phase-modulated signal from a transmitter circuit to a receiver circuit.

FIG. 1A illustrates an example of a system 100 that transmits a timing signal and a phase-modulated signal from a transmitter circuit to a receiver circuit. The transmitter circuit encodes a data signal to be output as a phase-modulated signal. The receiver circuit decodes the data from the phase-modulated signal by sampling the phase modulated data using the timing signal.

System 100 includes a transmitter circuit 141 and a receiver circuit 142. The transmitter circuit 141 includes a timing signal generation (TSG) circuit 101, delay circuits 102-103, multiplexer circuits 104-105, registers 131-132, and driver circuits 106-107. The receiver circuit 142 includes receiver circuits 111-112 and flip-flops 113-114. The transmitter circuit 141 and the receiver circuit 142 can be in two different integrated circuits or on the same integrated circuit. The transmitter 141 and receiver 142 are coupled together through transmission lines 121-122. Transmission lines 121-122 can be off-chip or on-chip and may be implemented using conductive signal traces such as striplines, microstrip traces or other types of signal lines.

As an example that is not intended to be limiting, one of these two integrated circuits can be a memory device, and the other integrated circuit can control the operation of the memory device. For example, one of the integrated circuits can be a memory controller device, such as a processor, application specific integrated circuit (ASIC), System on chip (SOC), etc., and the other integrated circuit can be a memory device such as DDR SDRAM, any generation of graphics memory (GDDR), or any memory device that includes an array of memory cells, for example, dynamic random access memory (RAM) cells, static RAM (SRAM) cells or a non volatile memory device such as a Flash device.

In one embodiment, timing signal generation circuit 101 generates a first timing signal Early CLK. Timing signal generation (TSG) circuit 101 can be an oscillator circuit (e.g., a voltage controlled oscillator of a phase-locked loop (PLL)), a delay-locked loop (DLL), or a timing reference that is sourced externally. Delay circuit 102 delays the Early CLK signal to generate a second timing signal Nominal CLK. Delay circuit 103 delays the Nominal CLK signal to generate a third timing signal Late CLK.

The timing signals Early CLK, Nominal CLK, and Late CLK can be, for example, periodic clock signals. In an embodiment, the Nominal CLK signal can be a strobe signal that indicates to the receiver circuit 142 when to sample the data.

Delay circuit 102 can provide any suitable delay to Nominal CLK relative to Early CLK, and delay circuit 103 can provide any suitable delay to Late CLK relative to Nominal CLK. For example, delay circuit 102 can provide a delay of 90° or slightly less than 90° to Nominal CLK relative to Early CLK, and delay circuit 103 can provide a delay of 90° or slightly less than 90° to Late CLK relative to Nominal CLK. As another example, delay circuit 102 can provide a delay between 0° and 90° to Nominal CLK relative to Early CLK, and delay circuit 103 can provide a delay between 0° and 90° to Late CLK relative to Nominal CLK.

Using delays of slightly less than 90° in each of the delay circuits 102-103 may generate runt pulses in the Nominal CLK signal. Runt pulses in the Nominal CLK signal limit the run length of the sampled data signals generated by the receiver circuit 142 to less than 2 unit intervals (or 2 bits). Each unit interval is a symbol period in the data signal. The runt pulses reduce inter-symbol interference (ISI) in the sampled data signals.

Transmitter circuit 141 receives an input data signal Data In. In an embodiment, the Data In signal has a double data rate (DDR) with respect to the Nominal CLK signal such that the encoded output signal can be referenced to both rising and falling edges of the timing signal CLK Out, described in more detail below.

In an embodiment, delay circuits 102 and 103 are programmable delay circuits. The programmable delay values D1-D2 of delay circuits 102-103 are stored in registers 131-132 and are transmitted to inputs of delay circuits 102-103, respectively, as shown in FIG. 1A. The programmable delay values of delay circuits 102-103 can be varied to accommodate Data In signals that have different data signaling rates.

The Data In signal is transmitted to the select input of multiplexer 105. Multiplexer 105 selects either the Early CLK signal or the Late CLK signal as selected signal SS based on the logic state of the Data In signal. As an example, multiplexer 105 may select Early CLK when Data In is in a logic high state and Late CLK when Data In is in a logic low state.

The selected signal SS is an encoded phase-modulated representation of the data embodied in the Data In signal. The phase of the selected signal SS is skewed by multiplexer 105 transitioning between selecting the Early and Late CLK signals. The selected signal SS is transmitted to the input of driver circuit 107. Driver circuit 107 drives the selected signal SS as signal SS Out to receiver circuit 142 through transmission line 122.

Multiplexer circuit 104 is configured to transmit the Nominal CLK timing signal from the output of delay circuit 102 to the input of driver circuit 106. In an embodiment, multiplexer circuit 104 induces power supply induced jitter (PSIJ) to the Nominal CLK signal that matches the PSIJ induced in the output of multiplexer 105 which generates the selected signal SS. To this end, multiplexers 104 and 105 receive charge from the same power supply voltage.

Driver circuit 106 drives the Nominal CLK signal to receiver circuit 142 through transmission line 121 as timing signal CLK Out. Driver circuits 106-107 transmit the CLK Out and SS Out signals in parallel through transmission lines 121-122 to inputs of receiver circuits 111-112, respectively, in receiver circuit 142. Driver circuits 106 and 107 can be implemented, for example, by respective pairs of pull-up and pull-down driver transistors.

Receiver circuit 111 buffers the CLK Out signal to generate a buffered timing signal CLK In. The CLK In signal is transmitted from the output of receiver circuit 111 to the timing inputs of flip-flops 113 and 114. Receiver circuit 112 buffers the selected signal SS Out to generate a buffered signal SS In. The SS In signal is transmitted from the output of receiver circuit 112 to the D inputs of flip-flops 113 and 114. Flip-flops 113-114 function as sampler circuits that generate Even and Odd samples of the data encoded in the selected signal SS In. The Even samples of the data are generated on the falling edges of the CLK In signal, and the Odd samples of the data are generated on the rising edges of the CLK In signal. Each Even and Odd sample of the data is generated in one unit interval of the data. The Even and Odd samples are generated as Even Data and Odd Data signals at the outputs of flip-flops 113-114, respectively.

Flip-flop 113 stores the value of the selected signal SS In at its Q and QB outputs as a differential Even Data signal in response to each falling edge of the CLK In signal. Flip-flop 114 stores the value of the selected signal SS In at its Q and QB outputs as a differential Odd Data signal in response to each rising edge of the CLK In signal.

Flip-flop 113 generates one sampled bit in the Even Data signal that represents a bit in the Data In signal for each even-numbered unit interval. Flip-flop 114 generates one sampled bit in the Odd Data signal that represents a bit in the Data In signal for each odd-numbered unit interval. Two unit intervals occur in each period of the Nominal CLK signal, and each unit interval corresponds to one symbol period in the Data In signal. Flip-flops 113-114 generate two sampled bits of data that represent the Data In signal in each period of the CLK In signal.

In an embodiment, delay circuits 102 and 103 cause the edges of the Nominal CLK signal to be halfway between corresponding edges of the Early and Late CLK signals. As a result, the edges of the CLK In signal are substantially in the centers of the sampling windows of the selected signal SS In. Receiver circuit 142 does not need to shift the phase of the CLK In signal to achieve the phase alignment needed to sample data encoded in the selected signal SS In. As a result, system 100 may benefit from reduced power consumption and complexity at receiver circuit 142. For example, system 100 can operate at high signal frequencies without using an alignment circuit in receiver circuit 142 that centers a sampling timing signal in the data sampling window. In receiver circuit 142, the CLK In signal is transmitted directly from an input pin through receiver circuit 111 to the timing inputs of flip-flops 113-114.

The Nominal CLK signal is routed through delay circuit 102, multiplexer 104, driver circuit 106, and receiver circuit 111 as signals CLK Out and CLK In. The selected signal SS is routed through multiplexer 105, driver circuit 107, and receiver circuit 112 as signals SS Out and SS In. The selected signal SS is also routed through delay circuits 102-103 when the Data In signal is in one of its two logic states. Thus, in an embodiment, the Nominal CLK and SS signals are routed through matching circuit elements, except that the SS signal is routed through one more or one less delay circuit. Each of the circuits 102-107 receives charge from the same power supply voltage. In this example, system 100 generates nearly the same PSIJ in the CLK Out and SS Out signals. The one extra delay circuit that is not in common between the paths of the CLK Out and SS Out signals generates different PSIJ between the CLK Out and SS Out signals that accumulates for less than one-half of a unit interval. As a result, the extra delay circuit does not adversely affect the timing relationship between these signals.

Figure 1B:
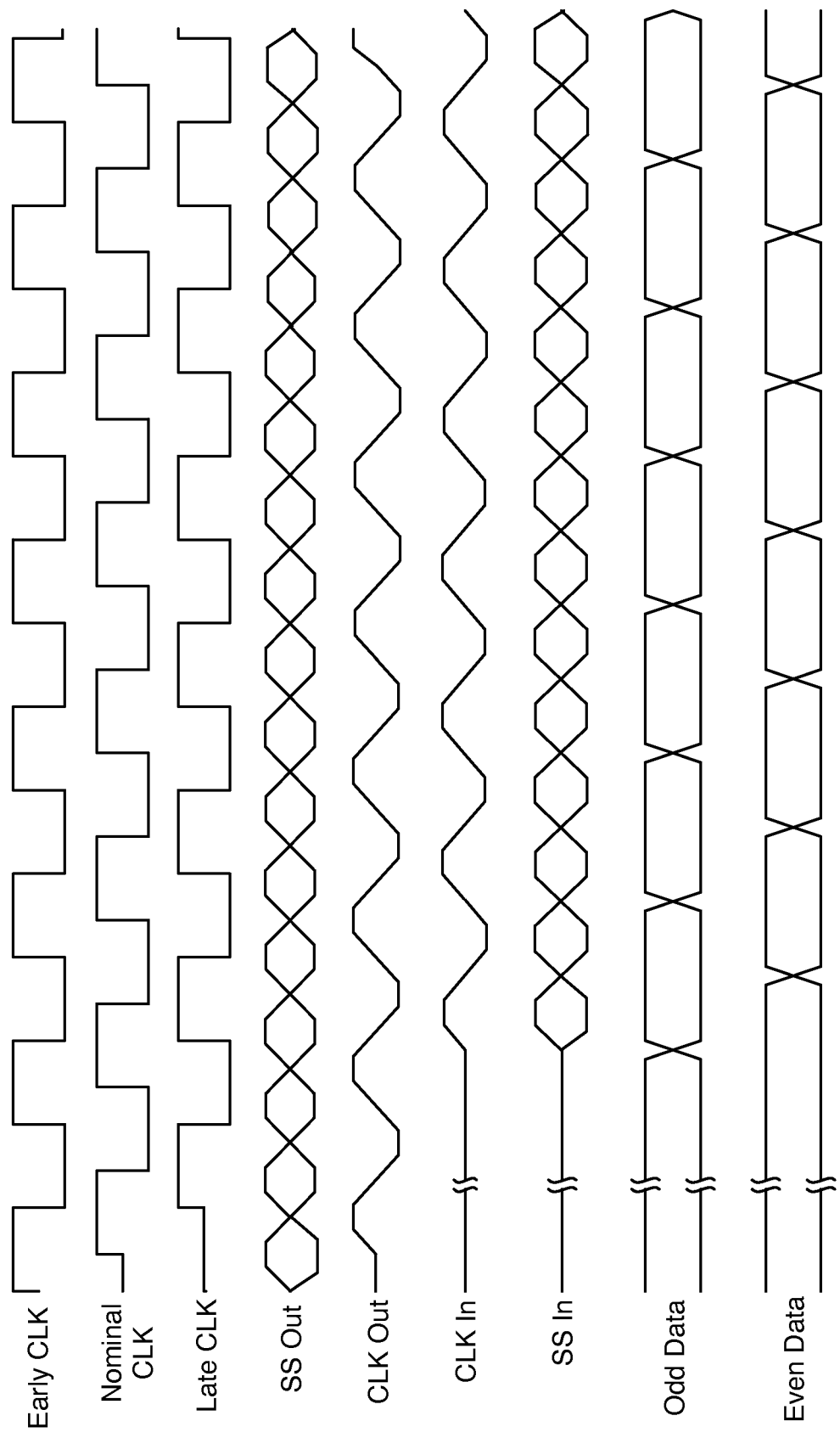
FIG. 1B is a timing diagram that illustrates example waveforms for various signals in the system of FIG. 1A.

FIG. 1B is a timing diagram that illustrates example waveforms of the Early CLK, Nominal CLK, Late CLK, SS Out, SS In, CLK Out, CLK In, Odd Data and Even Data signals in system 100 of FIG. 1A. In the example of FIG. 1B, the Nominal CLK signal is delayed by 90° relative to the Early CLK signal, and the Late CLK signal is delayed by 90° relative to the Nominal CLK signal. The waveform of the SS Out signal is based on the Data In signal (not shown in FIG. 1B) causing multiplexer 105 to transition between selecting the Early and Late CLK signals.

As shown in FIG. 1B, transmission line 121 delays the CLK IN signal relative to the CLK Out signal, and transmission line 122 delays the SS In signal relative to the SS Out signal. Also, as shown in FIG. 1B, the Odd Data signal transitions in response to each rising edge of the CLK In signal, and the Even Data signal transitions in response to each falling edge of the CLK In signal.

Figure 2:
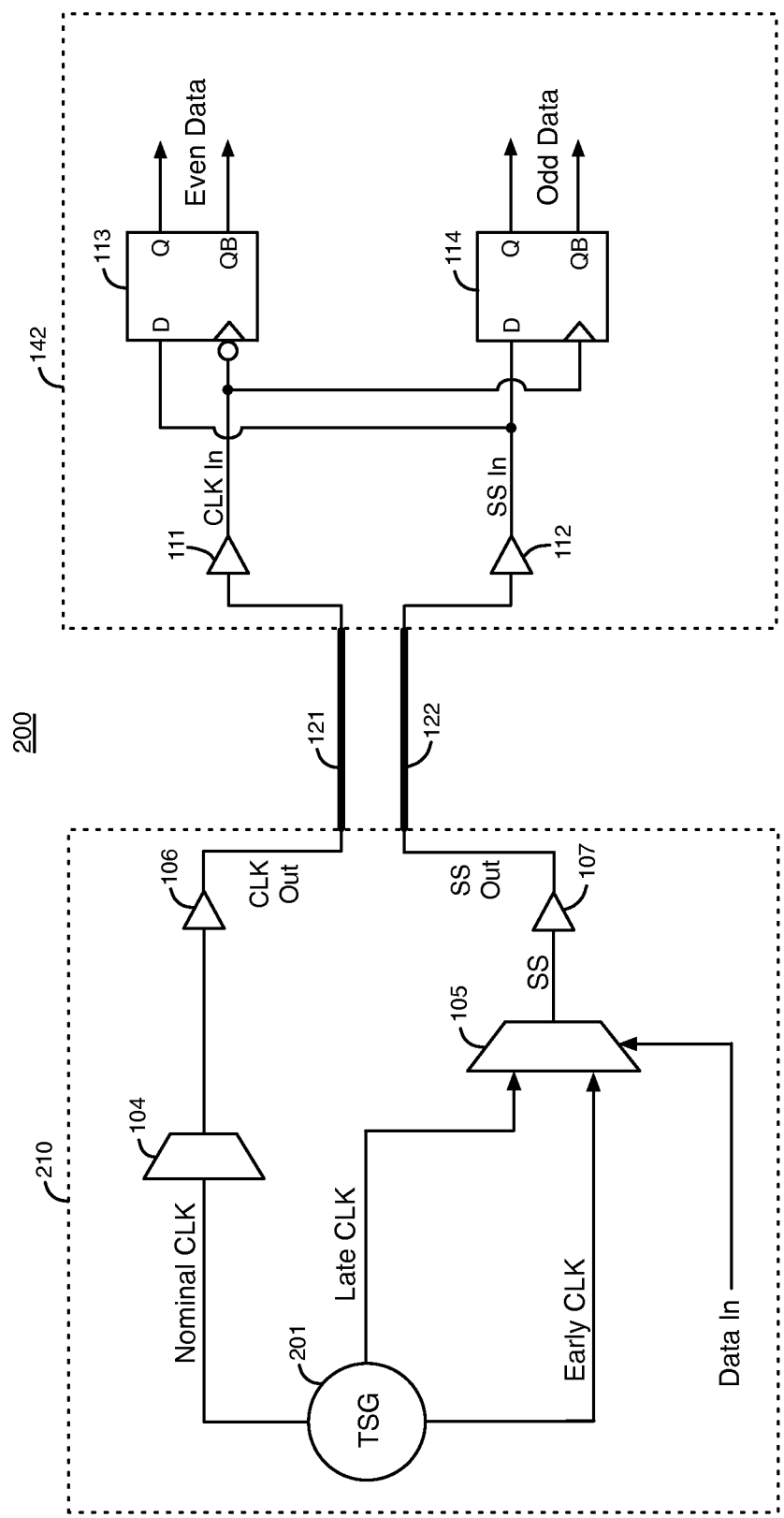
FIG. 2 illustrates another example of a system that transmits a timing signal and a phase-modulated signal from a transmitter circuit to a receiver circuit.

FIG. 2 illustrates another example of a system 200 that transmits a timing signal and a phase-modulated signal from a transmitter circuit to a receiver circuit. System 200 also includes a transmitter circuit 210 and a receiver circuit 142.

The transmitter circuit 210 includes a timing signal generation (TSG) circuit 201, multiplexer circuits 104-105, and driver circuits 106-107. The receiver circuit 142 includes receiver circuits 111-112 and flip-flops 113-114. The transmitter circuit 210 and the receiver circuit 142 can be in two different integrated circuits or on the same integrated circuit. Multiplexer circuits 104-105, driver circuits 106-107, receiver circuits 111-112, and flip-flops 113-114 function as described above with respect to FIG. 1A.

In system 200, TSG circuit 201 generates the Early CLK signal, the Nominal CLK signal, and the Late CLK signal without using delay circuits 102-103. TSG circuit 201 can be, for example, a ring oscillator formed by delay circuits coupled in a ring configuration. The ring oscillator can be part of a phase-locked loop circuit (PLL) and instantiated as a voltage controlled oscillator. Delay circuits in the ring oscillator can generate the Early CLK, Nominal CLK, and Late CLK signals. As another example, TSG circuit 201 can be an inductor-capacitor (LC) tank oscillator or a crystal oscillator that generates the Early CLK, Nominal CLK, and Late CLK signals. TSG circuit 201 may cause the Early CLK and Nominal CLK signals to be offset in phase by 90° or less. TSG circuit 201 may cause the Nominal CLK and Late CLK signals to be offset in phase by 90° or less. Alternatively, or in combination with TSG circuit 201, a delay-locked loop circuit can be used where multiple output signals of the delay-locked loop are multiplexed from a delay line to create the delays in the Nominal and Late CLK signals.

Figure 3A:
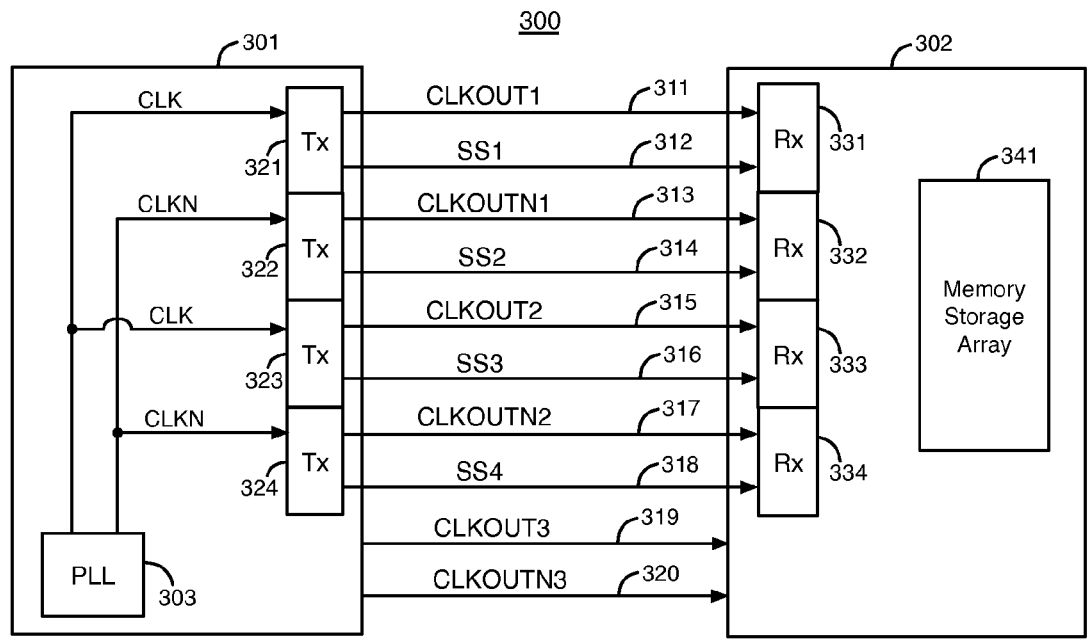
FIG. 3A illustrates an example of a system that provides crosstalk cancellation between signals transmitted through adjacent transmission lines from transmitter circuits to receiver circuits.

FIG. 3A illustrates an example of a system 300 that provides crosstalk cancellation between signals transmitted through adjacent transmission lines from transmitter circuits to receiver circuits. System 300 includes an integrated circuit 301, an integrated circuit 302, and transmission lines 311-320. Integrated circuits 301 and 302 can be any types of integrated circuits. As an example that is not intended to be limiting, integrated circuit 301 can be a memory controller integrated circuit, and integrated circuit 302 can be a memory integrated circuit.

Integrated circuit (IC) 301 includes a phase-locked loop (PLL) circuit 303 and transmitter circuits 321-324. PLL 303 generates timing signals CLK and CLKN. Timing signal CLKN is the inverse of timing signal CLK. Signals CLK and CLKN can be, for example, periodic clock signals. Integrated circuit (IC) 302 includes receiver circuits 331-334 and a storage array 341 of memory cells. Transmitter circuits 321-324 transmit signals through transmission lines 311-318 to receiver circuits 331-334.

In one embodiment, system 300 is implemented using the circuit architecture shown in FIG. 1A. In this embodiment, TSG circuit 101 is located in PLL circuit 303, and each of the transmitter circuits 321-324 includes circuits 102-107 coupled as shown in FIG. 1A. Alternatively or in combination, PLL circuit 303 may be a delay-locked loop circuit (DLL). Transmitter circuits 321 and 323 use timing signal CLK as the Early CLK signal. Delay circuits 102-103 in each of transmitter circuits 321 and 323 generate Nominal and Late CLK signals by delaying the CLK signal. Transmitter circuits 322 and 324 use timing signal CLKN as the Early CLK signal. Delay circuits 102-103 in each of transmitter circuits 322 and 324 generate Nominal and Late CLK signals by delaying the CLKN signal. Each of the receiver circuits 331-334 includes circuits 111-114 coupled as shown in FIG. 1A.

In another embodiment, system 300 is implemented using the circuit architecture shown in FIG. 2. In this embodiment, TSG circuit 201 is located in PLL circuit 303. Early, Nominal, and Late timing signals are transmitted from PLL 303 to transmitter circuits 321 and 323. Inverted versions of the Early, Nominal, and Late timing signals are transmitted from PLL 303 to transmitter circuits 322 and 324.

Transmitters 321 and 323 transmit Nominal CLK through transmission lines 311 and 315 to receivers 331 and 333 as the CLKOUT1 and CLKOUT2 signals, respectively. Transmitters 322 and 324 transmit Nominal CLK through transmission lines 313 and 317 to receivers 332 and 334 as the CLKOUTN1 and CLKOUTN2 signals, respectively. CLKOUT1, CLKOUT2, CLKOUTN1, and CLKOUTN2 may be, for example, periodic clock signals or strobe signals.

Transmitter circuits 321-324 transmit phase-modulated signals SS1, SS2, SS3, and SS4 through transmission lines 312, 314, 316, and 318 to receiver circuits 331-334, respectively. IC 302 may, for example, store data sampled from signals SS1-SS4 in memory storage array 341. Timing signals CLKOUT3 and CLKOUTN3 are transmitted from IC 301 to IC 302 through transmission lines 319-320, respectively. Timing signal CLKOUT3 may be CLKOUT1 or CLKOUT2. Timing signal CLKOUTN3 may be CLKOUTN1 or CLKOUTN2. Timing signals CLKOUT3 and CLKOUTN3 may be, for example, periodic clock signals.

Each of the transmission lines 312, 314, 316, and 318 that transmits a phase-modulated signal SS1, SS2, SS3, or SS4 is adjacent to two transmission lines that transmit complementary timing signals. For example, transmission line 312 is adjacent to transmission lines 311 and 313 that transmit timing signals CLKOUT1 and CLKOUTN1, respectively. Signals CLKOUT1 and CLKOUTN1 are complementary timing signals that are 180° out of phase. Signals CLKOUT2 and CLKOUTN1 are complementary timing signals that are 180° out of phase. Signals CLKOUT2 and CLKOUTN2 are complementary timing signals that are 180° out of phase. Signals CLKOUTN2 and CLKOUT3 are complementary timing signals that are 180° out of phase.

As a result, crosstalk that CLKOUT1 generates in signal SS1 is cancelled out by crosstalk that CLKOUTN1 generates in SS1. Crosstalk that CLKOUTN1 generates in signal SS2 is cancelled out by crosstalk that CLKOUT2 generates in SS2. Crosstalk that CLKOUT2 generates in signal SS3 is cancelled out by crosstalk that CLKOUTN2 generates in SS3. Crosstalk that CLKOUTN2 generates in signal SS4 is cancelled out by crosstalk that CLKOUT3 generates in SS4.

Figure 3B:
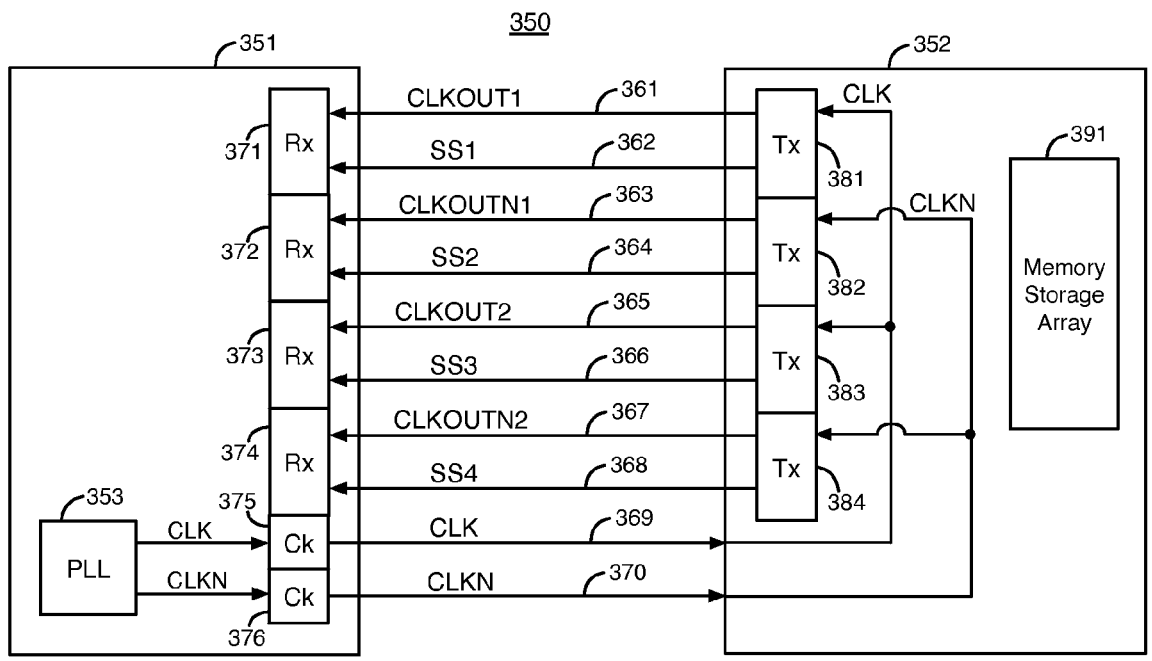
FIG. 3B illustrates another example of a system that provides crosstalk cancellation between signals transmitted through adjacent transmission lines from transmitter circuits to receiver circuits.

FIG. 3B illustrates another example of a system 350 that provides crosstalk cancellation between signals transmitted through adjacent transmission lines from transmitter circuits to receiver circuits. System 350 includes an integrated circuit 351, an integrated circuit 352, and transmission lines 361-370. Integrated circuits 351 and 352 can be any type of integrated circuits. As an example that is not intended to be limiting, IC 351 can be an integrated circuit device that controls the operation of a memory device, for example a memory controller device, such as a processor, application specific integrated circuit (ASIC), System on chip (SOC), etc. IC 352 can be a memory device, e.g., DDR SDRAM, any generation of graphics memory (GDDR), or any memory device that includes an array of memory cells, for example, dynamic random access memory (RAM) cells, static RAM (SRAM) cells or a non-volatile memory device such as a Flash device.

IC 351 includes PLL circuit 353, receiver circuits 371-374, and driver circuits 375-376. IC 352 includes transmitter circuits 381-384 and a storage array 391 of memory cells. Transmitter circuits 381-384 transmit signals through transmission lines 361-368 to receiver circuits 371-374. PLL 353 generates complementary timing signals CLK and CLKN that are 180° out of phase. Complementary timing signals CLK and CLKN are transmitted from PLL 353 to driver circuits 375-376, respectively. Driver circuits 375-376 transmit timing signals CLK and CLKN from IC 351 to IC 352 through transmission lines 369-370, respectively.

In an embodiment, each of transmitter circuits 381-384 includes circuits 102-107 coupled as shown in FIG. 1A, and TSG circuit 101 is located in PLL circuit 353. Each of the receiver circuits 371-374 includes circuits 111-114 coupled as shown in FIG. 1A. In this embodiment, transmitter circuits 381 and 383 use signal CLK as the Early CLK signal. Delay circuits 102-103 in each of transmitter circuits 381 and 383 generate Nominal and Late CLK signals by delaying the CLK signal. Transmitter circuits 382 and 384 use signal CLKN as the Early CLK signal. Delay circuits 102-103 in each of transmitter circuits 382 and 384 generate Nominal and Late CLK signals by delaying the CLKN signal.

Transmitter circuits 381 and 383 transmit Nominal CLK through transmission lines 361 and 365 to receiver circuits 371 and 373 as the CLKOUT1 and CLKOUT2 signals, respectively. Transmitter circuits 382 and 384 transmit Nominal CLK through transmission lines 363 and 367 to receiver circuits 372 and 374 as the CLKOUTN1 and CLKOUTN2 signals, respectively. Transmitter circuits 381-384 transmit phase-modulated signals SS1, SS2, SS3, and SS4 through transmission lines 362, 364, 366, and 368 to receiver circuits 371-374, respectively. IC 352 may, for example, read data that is encoded in signals SS1-SS4 from memory storage array 391.

In system 350, signals CLKOUT1 and CLKOUTN1 are 180° out of phase. Signals CLKOUT2 and CLKOUTN1 are 180° out of phase. Signals CLKOUT2 and CLKOUTN2 are 180° out of phase.

Each of the transmission lines 362, 364, and 366 that transmits a phase-modulated signal SS1-SS3 is adjacent to two transmission lines that transmit complementary timing signals. For example, transmission line 362 is adjacent to transmission lines 361 and 363 that transmit complementary timing signals CLKOUT1 and CLKOUTN1. Crosstalk that CLKOUT1 generates in signal SS1 is cancelled out by crosstalk that CLKOUTN1 generates in SS1. Crosstalk that CLKOUTN1 generates in signal SS2 is cancelled out by crosstalk that CLKOUT2 generates in SS2. Crosstalk that CLKOUT2 generates in signal SS3 is cancelled out by crosstalk that CLKOUTN2 generates in SS3. Although crosstalk generated by CLKOUTN2 and CLK in SS4 is not cancelled, a filter circuit can be placed in IC 351 to filter out the effects of crosstalk in SS4.

In another embodiment, system 350 is implemented using the circuit architecture shown in FIG. 2. In this embodiment, TSG circuit 201 is located in PLL circuit 353. Early, Nominal, and Late timing signals are transmitted from PLL 353 to transmitter circuits 381 and 383. Inverted versions of the Early, Nominal, and Late timing signals are transmitted from PLL 353 to transmitter circuits 382 and 384.

The embodiments of FIGS. 3A-3B substantially reduce the crosstalk that timing signal transmission lines generate in adjacent transmission lines that transmit the phase-modulated signals. Transmission lines that are arranged to transmit an alternating pattern of timing and phase-modulated signals as shown in FIGS. 3A-3B can be placed closer together, reducing the routing impact of additional transmission lines.

Any two complementary timing signals transmitted through transmission lines in systems 300 and 350 can be used to generate a constant reference voltage. For example, a resistor divider can be coupled between transmission lines 311 and 313 in system 300 to generate a constant reference voltage. The reference voltage can be used for a variety of purposes. For example, if receiver circuits 111-112 are differential amplifiers, the reference voltage can be used by receiver circuits 111-112 to amplify the CLK Out and SS Out signals.

The integrated circuits shown and described herein can be, for example, memory integrated circuits, controller integrated circuits, processor integrated circuits, analog integrated circuits, digital integrated circuits, programmable integrated circuits, etc.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. An integrated circuit device comprising:
    timing circuitry to generate a nominal timing signal, an early phase timing signal, and a late phase timing signal complementary with the early phase timing signal, the timing circuitry comprising a first delay circuit that generates the nominal timing signal using the early phase timing signal, and a second delay circuit to generate the late phase timing signal from the nominal timing signal;
    a multiplexer having a first multiplexer input to receive the early phase timing signal, a second multiplexer input to receive the late phase timing signal, and a select input to receive a data signal, the multiplexer outputting a phase modulated signal by selecting between the early phase timing signal and the late phase timing signal based on a logic state of the data signal;
    a first output driver coupled to the timing circuitry to output the nominal timing signal; and
    a second output driver coupled to the multiplexer to output the phase modulated signal.

2. The integrated circuit device of claim 1 wherein the timing circuitry comprises an oscillator.

3. The integrated circuit device of claim 2 wherein the oscillator is part of a phase-locked loop circuit.

4. The integrated circuit device of claim 1 wherein the nominal timing signal is a strobe signal.

5. The integrated circuit device of claim 1 wherein the nominal timing signal is a clock signal.

6. The integrated circuit device of claim 1, further comprising:
a first register circuit to store a first value that is representative of a delay time between a phase of the early phase timing signal and a phase of the nominal timing signal; and
a second register circuit to store a second value that is representative of a delay time between the phase of the nominal timing signal and a phase of the late phase timing signal.

7. The integrated circuit device of claim 1, further comprising a storage array that includes a plurality of memory cells.

8. The integrated circuit device of claim 1, wherein the integrated circuit devices is a memory controller device.

9. A method of operation of an integrated circuit device, the method comprising:
generating an early phase timing signal and a late phase timing signal complementary with the early phase timing signal;
outputting a nominal timing signal to a first external signal line, wherein outputting the nominal timing signal comprises outputting a transition of the nominal timing signal;
generating a phase modulated signal by selecting, based on a logic state of a data signal, between early phase timing signal and the late phase timing signal; and
outputting the phase modulated signal to a second external signal line, wherein outputting the phase modulated signal comprises:
for a first logic state of the data signal, outputting a transition of the phase modulated signal that precedes the transition of the nominal timing signal; and
for a second logic state of the data signal, outputting a transition of the phase modulated signal that succeeds the transition of the nominal timing signal.

10. The method of claim 9, wherein outputting the phase modulated signal further comprises:
for the first logic state of the data signal, outputting a transition of the phase modulated signal that precedes the transition of the nominal timing signal by a first predetermined phase amount; and
for the second logic state of the data signal, outputting a transition of the phase modulated signal that succeeds the transition of the nominal timing signal by a second predetermined phase amount.

11. The method of claim 9, further comprising generating an internal timing reference signal to provide the early phase timing signal.

12. The method of claim 11 further comprising:
delaying the early phase timing signal to generate the nominal timing signal; and
delaying the nominal timing signal to generate the late phase timing signal.

13. The method of claim 9 wherein the nominal timing signal is a strobe signal.

14. The method of claim 9 wherein the nominal timing signal is a clock signal.

15. A system comprising:
a circuit to provide complementary timing signals, including an early timing signal and a late timing signal, wherein the late timing signal is delayed relative to the early timing signal;
a selection circuit to select, based on a logic state of a data signal, between the early and the late timing signals, the selection circuit to generate a phase modulated signal from the selection between the early and late timing signals;
a driver to transmit a nominal clock signal; and
at least one sampler to sample the phase modulated signal responsive to the nominal clock signal.

16. The system of claim 15, the at least one sampler including a first sampler to sample the phase modulated signal responsive to rising edges of the nominal clock signal and a second sampler to sample the phase modulated signal responsive to falling edges of the nominal clock signal.

17. A system comprising:
clock circuitry to convey a nominal timing signal, an early phase timing signal, and a late phase timing signal;
a data node to receive an input data signal;
a multiplexer having:
a first multiplexer input to receive an early phase timing signal;
a second multiplexer input to receive the late phase timing signal; and
a select input to receive the input data signal;
the multiplexer outputting a phase modulated signal by selecting between the early phase timing signal and the late phase timing signal responsive to the input data signal; and
a receiver circuit including a first sampler to sample the phase modulated signal responsive to rising and falling edges of the nominal timing signal.

18. The system of claim 17, wherein the early phase timing signal and the late phase timing signals are complementary.

19. The system of claim 17, wherein the nominal timing signal is phase offset from at least one of the early phase timing signal and the late phase timing signal by less than 90 degrees.

* * * * *